(12) United States Patent
Kuehnis et al.

(10) Patent No.: US 10,088,514 B2
(45) Date of Patent: Oct. 2, 2018

(54) ORIENTATION INDICATOR WITH PIN SIGNAL ALTERATION

(71) Applicant: Intel Corporation, Santa Clara, CA (US)

(72) Inventors: Rolf Kuehnis, Vesilahti (FI); Robert A. Dunstan, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 14/979,243

(22) Filed: Dec. 22, 2015

(65) Prior Publication Data

US 2017/0003346 A1    Jan. 5, 2017

Related U.S. Application Data

(60) Provisional application No. 62/186,626, filed on Jun. 30, 2015.

(51) Int. Cl.
| | |
|---|---|
| *G06F 3/00* | (2006.01) |
| *G01R 31/04* | (2006.01) |
| *G06F 9/4401* | (2018.01) |
| *G06F 13/40* | (2006.01) |

(52) U.S. Cl.
CPC ......... *G01R 31/043* (2013.01); *G06F 9/4411* (2013.01); *G06F 13/40* (2013.01)

(58) Field of Classification Search
USPC ...................................... 710/10–16
See application file for complete search history.

(56) References Cited

U.S. PATENT DOCUMENTS

| | | | |
|---|---|---|---|
| 8,984,188 B2* | 3/2015 | Jol | H01R 29/00 709/220 |
| 8,996,771 B1 | 3/2015 | Lockwood | |
| 9,367,490 B2* | 6/2016 | Huang | G06F 13/10 |
| 9,535,117 B2* | 1/2017 | Menon | G01R 31/3177 |
| 9,612,991 B2* | 4/2017 | Leinonen | G06F 13/4081 |
| 2011/0093624 A1 | 4/2011 | Crumlin et al. | |
| 2013/0108063 A1 | 5/2013 | Verhoeve et al. | |
| 2015/0106544 A1 | 4/2015 | Leinonen et al. | |
| 2016/0179648 A1* | 6/2016 | Srivastava | G06F 11/3051 710/16 |
| 2016/0217092 A1* | 7/2016 | Huang | G06F 13/10 |
| 2017/0017595 A1* | 1/2017 | Schnell | G06F 13/385 |

OTHER PUBLICATIONS

Hewlett-Packard Development Company, L.P. et al., "Universal Serial Bus Type-C Cable and Connector Specification," USB 3.0 Promoter Group, USA, 2014, 171 pages, http://www.those.ch/designtechnik/wp-content/uploads/2014/08/USB-Type-C-Specification-Release-1.0.pdf.
PCT International Search Report, PCT Application No. PCT/US2016/028895, dated Jul. 29, 2016, 3 pages.

* cited by examiner

*Primary Examiner* — Raymond Phan
(74) *Attorney, Agent, or Firm* — International IP Law Group, P.L.L.C.

(57) ABSTRACT

Techniques described herein include a method, system, and apparatus for detecting an orientation configuration. For example, an apparatus having an all-in-one port may include a first configuration pin and a second configuration pin. The apparatus may also include logic configured to enter into an accessory mode based on a presence of a first signal on the first configuration pin and a second signal on the second configuration pin. The logic may be further configured to provide an orientation indication by altering the first signal on the first configuration pin.

21 Claims, 6 Drawing Sheets

215

300

ORIENTATION INDICATOR WITH PIN SIGNAL ALTERATION

CROSS-REFERENCE TO RELATED APPLICATION

The present application claims the benefit of U.S. Provisional Patent Application Ser. No. 62/186,626 by Kuehnis et al., which is entitled "Orientation Indication for All-In-One Connectors" and was filed Jun. 30, 2015, the contents of which is incorporated herein by reference as though fully set forth herein.

TECHNICAL FIELD

This disclosure relates generally to techniques for indicating an orientation of a connector at a computing device. Specifically, this disclosure relates to orientation of a computing device having an all-in-one connector.

BACKGROUND ART

Computing systems may include integrated circuits, systems on a chip (SOCs), and other circuit components configured to integrate multiple microcontrollers. Components of computing system may encounter errors. For example, each of the microcontrollers within a given may have their own firmware components as well as their own operating system driver components. Many of these microcontroller firmware and driver components may encounter errors that may need to be debugged.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
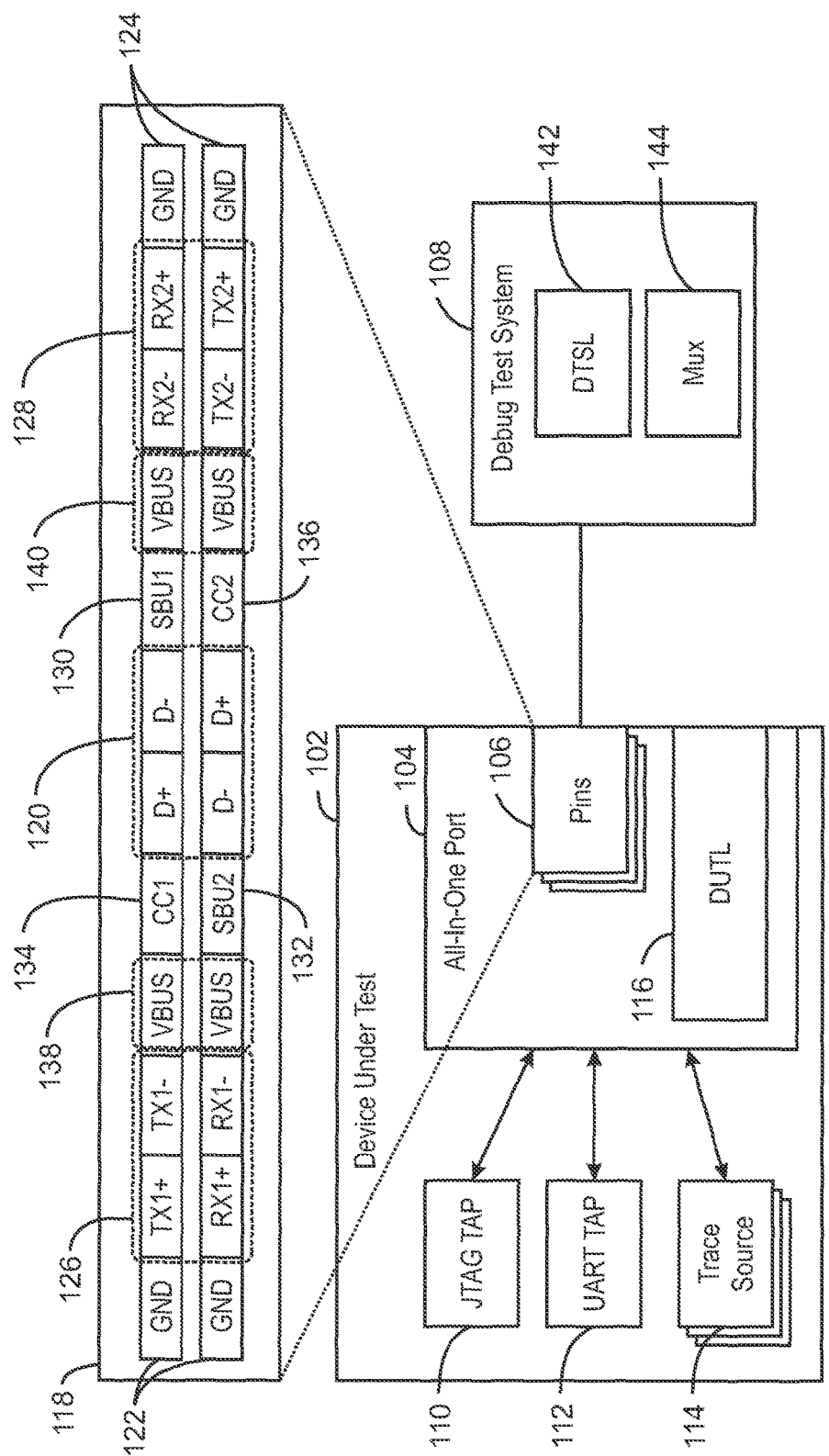
FIG. 1 illustrates a device under test having an all-in-one port to be communicatively coupled to a debugging system.

The present disclosure relates generally to techniques for detecting orientation in accessory mode at an all-in-one port. An all-in-one port may provide a power interface, may be at least partially or fully reversible, and may include general data interfaces as well as additional data-specific interfaces such as a display interface, an audio interface, and the like. Typically, orientation indications may be provided by detecting a signal on one of two or more configuration pins. For example, in the case where only two orientations are available, a signal at a first orientation pin and not at a second orientation pin may provide an orientation indication. However, during debug, a debug testing system may provide the same signal on each of the configuration pins to enter the target system into a debug accessory mode. Therefore, the orientation may not be readily detectable. The techniques described herein include logic at the target system that may enter a debug accessory mode when signals are detected at both a first and a second configuration pin. The accessory mode discussed herein may refer to a debug accessory mode and may also refer to other accessory modes including an audio accessory mode. The logic may then be configured to alter one of the signals to provide an orientation indication. The orientation indication may be received by logic of the debug test system having a multiplexer which may be configured based on the orientation indication. Although debug mode is generally discussed herein, the techniques may also be implemented to other interfaces and associated modes. Further, an accessory mode for an all-in-one port, as well as specific specifications for a port, maybe discussed throughout this disclosure, however the techniques disclosed herein can be implemented in any orientation determining context with suitable configuration and support as described below.

An example of an all-in-one port may include a Universal Serial Bus (USB) "Type C" connector, indicated in a specification standard entitled, "USB Type-C Cable and Connector Specification, Revision 1.1, Apr. 3, 2015," referred to herein as the "USB Type-C specification." As discussed in more detail below, the USB Type-C connector may include a reversible plug connector. Other all-in-one ports may be implemented in the debug techniques described herein. However, for simplicity, the all-in-one port may be interchangeably referred to herein as or as simply an all-in-one port in general or as an USB Type-C connector.

For context, in the USB Type-C specification, a debug accessory mode (DAM) may be entered by two ports when one asserts a pull up resistive value (Rp/Rp) (typically a downward facing port (DFP)) and is connected to another that asserts a pull down resistive value (Rd/Rd) (typically an upward facing port (UFP)). In an example, one port asserts two Rp's—one on each of two configuration pins (CC) in the receptacle, e.g. CC1 and CC2, while the other port asserts two Rd's—one each of the CC pins, e.g. CC1 and CC2, respectively. A cable may have one wire running through it that can be connected to the CC pin in a plug. The cable orientation may be determined as both ports can see the Rp and Rd connected through the cable because of the cable's voltage above ground, but less than the voltage applied to Rp. At the Rp port, the corresponding CC pin may be at the applied voltage while at the Rd port, the corresponding CC pin may be at ground. To detect debug mode in present implementations, two wires run through the cable to detect the presence of both Rds or Rps. However, while the use of the cable allows Rd/Rd or Rp/Rp to be detected, this detection can come at the cost of orientation information being lost. In the present disclosure a 'debug' cable can be used to connect both CC pins through the cable in order to be able to signal a connection in the debug mode, or other similarly signaled modes.

A target may be referred to herein as "device under test" (DUT), and may be either a DFP or UFP. A debug test system (DTS) is typically preconfigured to test either a DFP or UFP. Both the DTS and DUT enter the DAM mode when one detects both its resistive pull down values (Rds) are at a voltage higher than ground, say 2.5 volts (V) and when the other detects both its resistive pull up values (Rps) are at a voltage lower than its pull-up value, say 2.5V. However, in a generic sense, the techniques described herein may be implemented without reference to dual roles when configuration channels are used to initiate a debug mode, as well in the dual role scenario discussed above.

The technique described herein provides a debug test system with an orientation indication from a DUT. As DUTs may be more numerous and debug test systems may be less numerous, manufacturing costs associated with installing and executing orientation techniques can be reduced with implementing the present technique through the debug test systems.

FIG. 1 illustrates a target computing system having an all-in-one port to be communicatively coupled to a debugging system. A computing system 100 may include a device under test (DUT) 102 having an all-in-one port 104 having a plurality of pins 106. The pins 106 of the all-in-one port 104 may be configured to communicatively couple to a debug test system (DTS) 108. The DTS 108 may be configured to run one or more types of debugging operations at test access ports (TAPs), such as a Joint Test Action Group (JTAG) TAP 110, a universal asynchronous receiver/transmitter (UART) TAP 112, or any other type of debug TAP or Test Access Mechanisms (TAMs) or run-control mechanism. Although the DUT 102 of FIG. 1 illustrates both JTAG TAP 110 and UART 112, the DUT 102 may include any combination of the TAPs or run-control mechanisms shown, as well as any other type of port configured to provide access for generating debug trace data from trace sources 114, as well as any port for running a debug control process such as debug access port (DAP) that is not necessarily JTAG based. Trace data from the trace sources 114 may include trace statements indicating flow of execution processes for various components (not shown) of the DUT 102. The trace data may be provided from the trace sources 114 through the all-in-one port 104 to the DTS 108.

The all-in-one port 104 may include device under test logic (DUTL) 116. The DUTL 116 may be configured to enter into an accessory mode, and provide an orientation indication to the DTS 108, as discussed in more detail below. In some cases, the DUTL 116 may be configured to identify which of configuration channel signal may be used for universal serial bus "USB" Power Delivery (PD) communications. In this scenario, some systems may require a voltage bus (V$_{BUS}$) at a higher voltage to fully operate. Additionally, PD communication may be needed for additional reconfiguration of the all-in-one port 104.

As discussed above, the all-in-one port 104 may be implemented as a USB Type-C connector having pins 106, enumerated in the enlarged box 118. The USB Type-C connector 118 is an at least partially reversible plug connector. As indicated at the dashed box 120, data lines D+ and D− may be disposed on a top half of the USB Type-C connector 118 and on a bottom half of the connector such that they are diametrically opposed. The arrangement of the data lines at 120 provides reversible functionality such that a plug may be received in either a right side up or an upside down disposition at the USB Type-C connector 118.

In general the USB Type-C connector 118 may be used by both a target computing device, such as the DUT 102, and a test system, such as the DTS 108. As illustrated in FIG. 1, the USB Type-C connector 118 may include a 24-pin double-sided connector interface providing four power/ground pairs (GND) 122 and 124, two differential pairs (D+, D−) for USB 2.0 high speed (HS) data bus indicated at box 120, four pairs (TX1+, TX1−, RX1+, RX1−, TX2+, TX2−, RX2+, RX2−) for super-speed (SS) data bus indicated at the dashed boxes 126 and 128, two "sideband use" pins (SBU1 and SBU2) indicated at 130 and 132, a first configuration (CC1) pin 134 and a second configuration (CC2) pin 136 for cable orientation detection which may be biphase mark code (BMC) configuration data channel pins, and power interface pins (V$_{BUS}$) indicated by the dashed boxes 138 and 140. In an example, a CC signal path may be used for USB Power Delivery, or BMC, communications.

As discussed above, the DUTL 116 may be configured to enter into an accessory mode, and provide an orientation indication to the DTS 108. For example, when the DTS 108 is connected to the DUT 102, a signal may be presented to the CC1 pin 134 and the CC2 pin 136. In an example with an additional debug cable, the signal presented to each of the CC1 pin 134 and CC2 pin 136 pins may be the same value, such as a 2.5 volt value. Based on a presence of a first signal on CC1 pin 134 and second signal on a CC2 pin 136 having the same value, the logic may be configured to enter an accessory mode, such as a debug accessory mode (DAM). The DUTL 116 may be further configured to provide an orientation indication back to the DTS 108 by altering the first signal on one of the configuration channel pins, such as CC1 pin 134 or CC2 pin 136. For example, the signal provided by the DTS 108 may be a signal of 2.5 volts detected at the DUTL 116. The DUTL 116 may alter the signal by electrically removing a resistive pull down or pulling down to ground the signal at one of the configuration pins, such as the CC1 pin 134. This change may be detected by debug test system logic (DTSL) 142 of the DTS 108, and may be used to configure a multiplexer (MUX) 144 of the DTS based on the orientation indication such that debug operations may initiate. In this scenario, the all-in-one port 104 may be configured as an UFP. While this example shows DTS doing the multiplexing, in another example, the DTS signals and the DUT may detect and change the MUX.

In some cases, the DTS 108 is configured to test a DFP. In this scenario, the DTS 108 may be responsible for manipulating one resistive pull down (Rd) and the DUT 102 (acting as a DFP in this case) may be responsible for manipulating its MUXs (not shown) to correctly connect the signals. Further, in some cases, a DFP under test may remove a pull-up from one CC pin (such as CC1 pin 134 or CC2 pin 136) and the DTS 108 may be configured to detect the orientation and control the MUX 144.

Entering DAM and providing the orientation detection may also be done during a boot stage, or startup of the DUT 102 before an operating system associated with the DUT 102 has initialized. Therefore, the orientation detection may be provided with relatively low latency and used in early stage operation in comparison to other debug mode states that may require operating system functionality. In other words, the orientation indication may be provided without initializing software at the DUT 102, moving some operations of orientation configuration to the DTSL 142 and MUX 144 of the DTS 108.

Figure 2A:
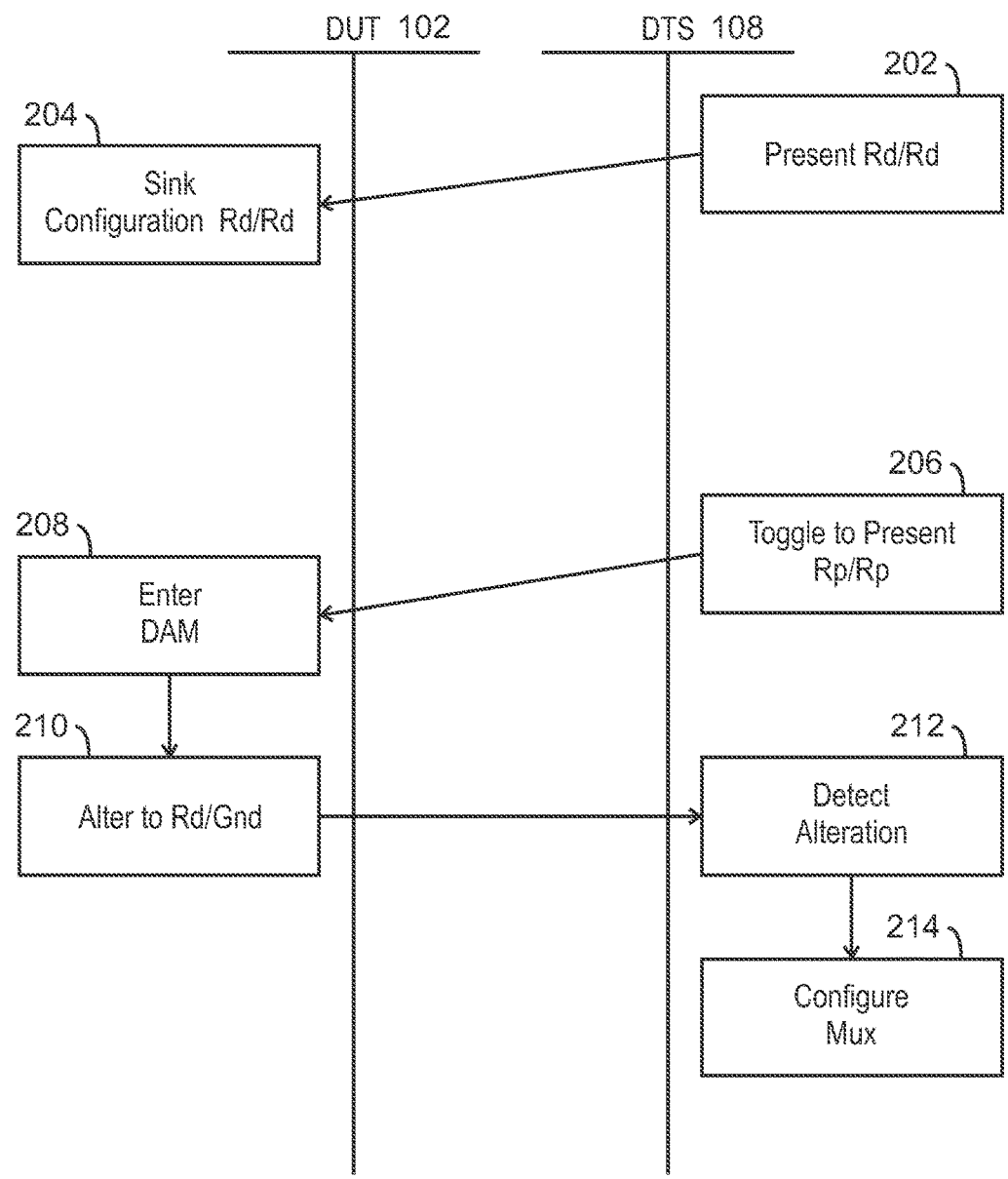
FIG. 2A is a sequence diagram illustrating a process for detecting orientation in accessory mode.

FIG. 2A is a sequence diagram illustrating a process for detecting orientation in accessory mode. At 202, a debug test system, such as the DTS 108 of FIG. 1, presents a signal to a target system, such as the DUT 102 of FIG. 1. As indicated at 202, the signal may be implemented using symmetric resistor levels on current sensing lines, wherein Rd/Rd represents a symmetric resistive pull-down occurring at the CC1 pin 134 and CC2 pin 136 of FIG. 1 from the perspective of the DTS 108. As the DUT 102 detects the signals on each of the CC1 pin 134 and CC2 pin 136 having symmetric resistor levels the DUT 102 may enter a sink configuration wherein the DUT 102 acts as a device, as opposed to a host, as indicated at 204. At block 206, the DTS 108 may toggle to present Rp/Rp—a symmetric resistive pull-up occurring at the CC1 in 134 and CC2 pin 136 from the perspective of the DTS 108. In response, the DUT 102 may enter an accessory mode at block 208, such as the DAM discussed above in regard to FIG. 1. At block 210, logic, such as the DUTL 116 of the DUT 102, may be configured to alter the signal as detected by the DTS to provide an orientation indication. At block 212, the alteration is detected and at block 214, the MUX 144 is configured. For example, the Rd/Rd signal presented at 202 from the perspective of the DTS 108 may be altered such that the DTS 108 may detect the same resistive level Rd on one configuration pin and a ground (GND) on another configuration pin. As another example, the signal may be altered such that the DTS 108 may detect the same resistive level Rd on one configuration pin and Rp on a second configuration pin. In other words, sensing of a voltage level (Vcc1 and Vcc2) of each of the CC1 pin 134 and CC2 pin 136 may be performed. If a Vcc1−Vcc2=0, then the DUT 102 is in accessory mode. If Vcc1−Vcc2>0 then the MUX 144 is in a default position. If Vcc1−Vcc2<0 then the MUX 144 is switched to an alternate orientation. Although the equations presented herein may be used for reference, in implementation some threshold Vcc may be integrated to compensate for resistor value tolerances used on the all-in-one port 104.

Although FIG. 2A discusses various resistive signaling including Rp and Rd, as well as GND, the techniques described herein may be implemented using any various resistive signaling, current sources and/or sinks in place of resistors, or any combination thereof, and may be based on the perspective of either the DTS 108 or the DUT 102. For example, the DTS 108 may provide a symmetric signal to the DTS 108. This signal may be viewed as a pull-up by the DUT 102 and a pull down by the DTS 108. In any perspective, the techniques provided herein enable the DUT 102 to enter a debug mode without initializing software while still providing a configuration indication that may otherwise be provided with software.

Figure 2B:
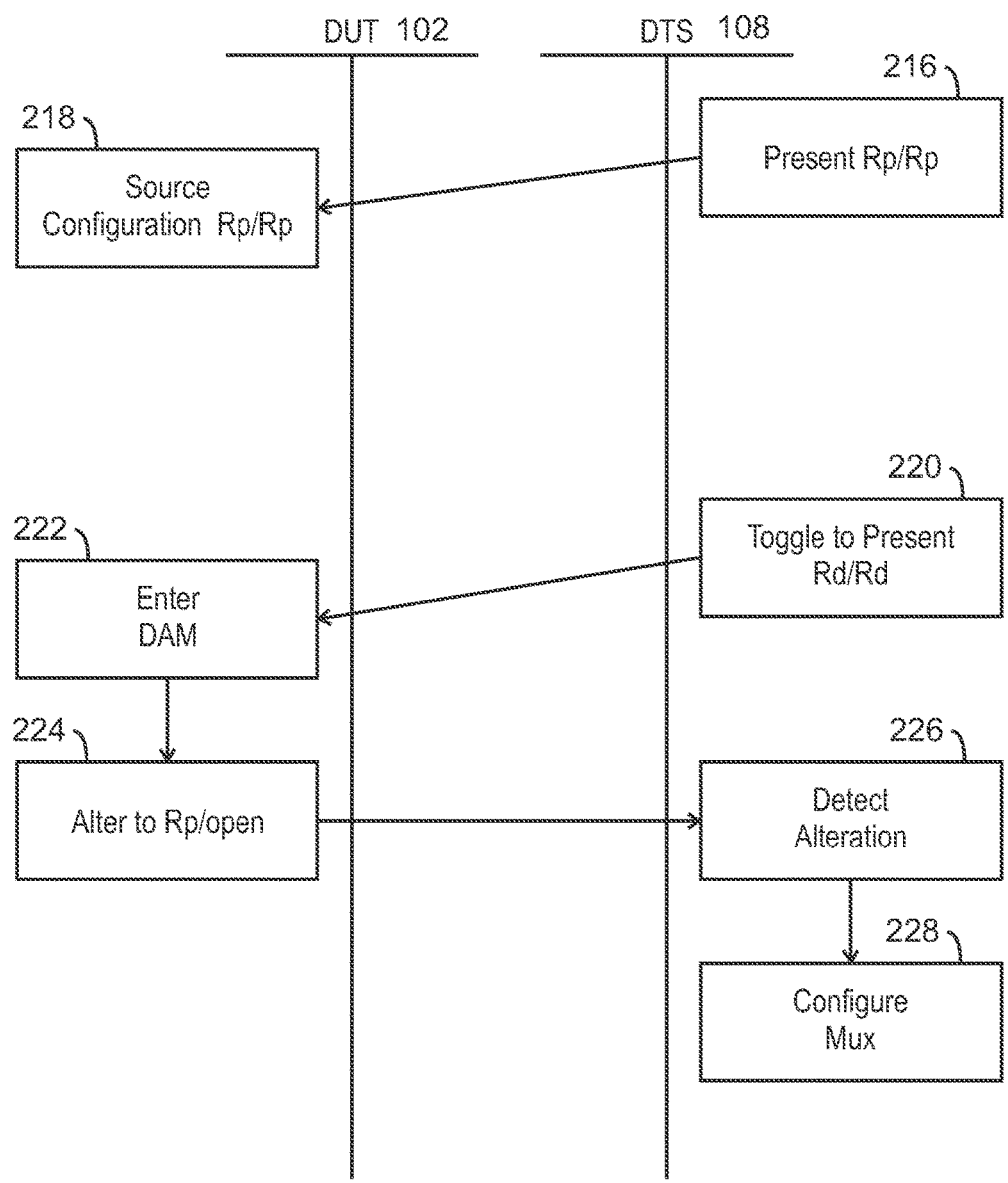
FIG. 2B is a sequence diagram illustrating a process for detecting orientation in accessory mode when a device under test is a downward facing port.

FIG. 2B is a sequence diagram illustrating a process for detecting orientation in accessory mode when a device under test is a downward facing port. At 202, a debug test system, such as the DTS 108 of FIG. 1, presents a signal to a target system, such as the DUT 102 of FIG. 1. As indicated at 216, the signal may be implemented using symmetric resistor levels on current sensing lines, wherein Rp/Rp represents a symmetric resistive pull-up occurring at the CC1 pin 134 and CC2 pin 136 of FIG. 1 from the perspective of the DTS 108. As the DUT 102 detects the signals on each of the CC1 pin 134 and CC2 pin 136 having symmetric resistor levels the DUT 102 may enter a source configuration wherein the DUT 102 acts as a host, as opposed to a device, as indicated at 218. At block 220, the DTS 108 may toggle to present Rd/Rd—a symmetric resistive pull-down occurring at the CC1 pin 134 and CC2 pin 136 from the perspective of the DTS 108. In response, the DUT 102 may enter an accessory mode at block 222, such as the DAM discussed above in regard to FIG. 1. At block 224, logic, such as the DUTL 116 of the DUT 102, may be configured to alter the signal as detected by the DTS to provide an orientation indication. For example, the Rp/Rp signal presented at 216 from the perspective of the DTS 108 may be altered such that the DTS 108 may detect the same resistive level Rd on one configuration pin and an open signal value, or Rp, on another configuration pin. At block 226, the alteration is detected and at block 228, the MUX 144 is configured.

Figure 3:
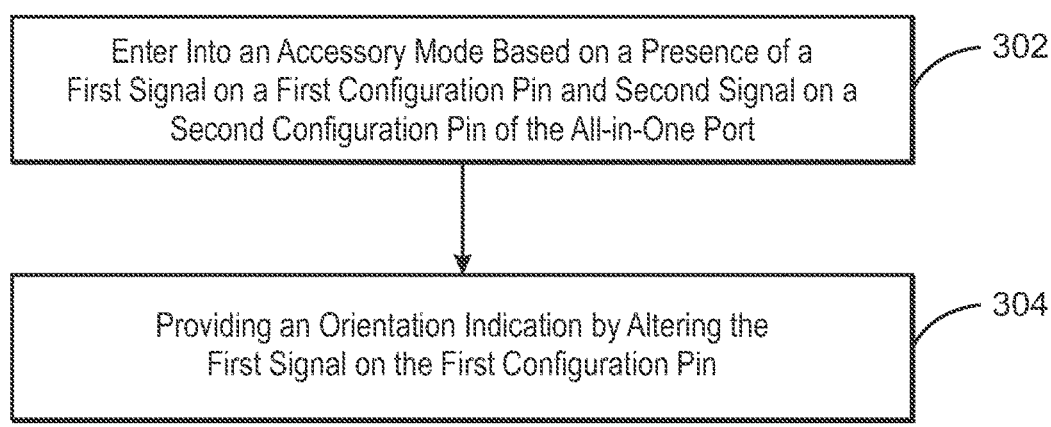
FIG. 3 is a flow diagram illustrating the process for detecting orientation in accessory mode.

FIG. 3 is a flow diagram illustrating a method 300 for detecting orientation in accessory mode. At block 302, the method 300 may include entering into an accessory mode based on a presence of a first signal on a first configuration pin and second signal on a second configuration pin of the all-in-one port. At block 304, the method 300 may include providing an orientation indication by altering the first signal on the first configuration pin.

In some cases, the orientation indication is provided without initializing software associated with the all-in-one port. Further, in some cases, the accessory mode is a debug accessory mode. In this scenario, the presence of the signal on both the first and second configuration pins at block 302 is provided by a debug test system.

The method 300 may also include multiplexing at the debug test system based on the orientation indication. In some cases, the method 300 may also include configuring the all-in-one port may be configured either as a source or a sink. In this scenario, the all-in-one is configured as a sink during debug accessory mode.

Altering the signal at block 304 may include reducing a voltage level of the first signal on the first configuration pin. In this scenario, reducing the voltage level on the first signal of the first configuration pin comprises grounding the first signal. However, in some cases, altering the first signal on the first configuration pin comprises increasing a voltage level of the first signal on the first configuration pin.

Figure 4:
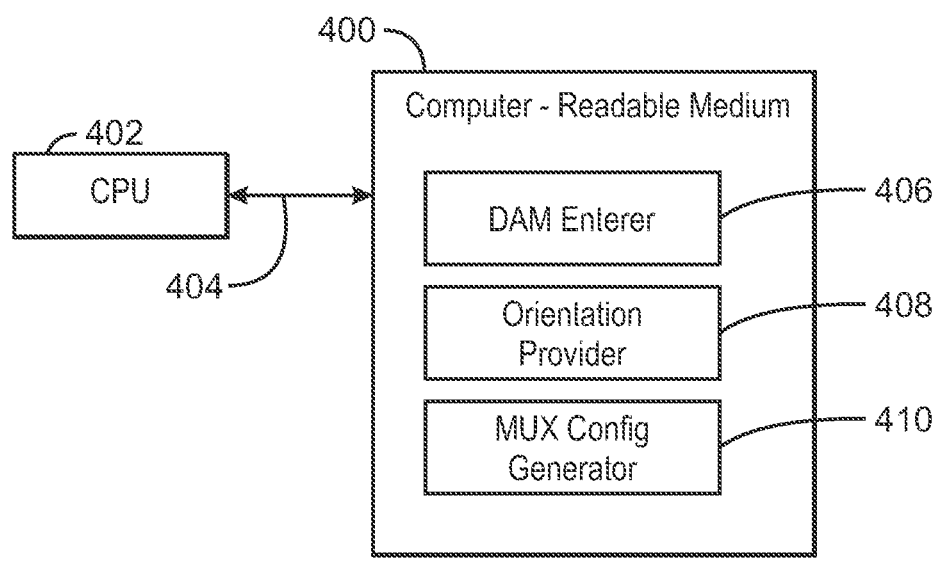
FIG. 4 is a block diagram of a tangible, non-transitory, computer-readable medium to provide an orientation of a connector.

FIG. 4 is a block diagram depicting an example of a tangible non-transitory, computer-readable medium 400 that can facilitate a query and contextual access with data processing and graph operations. The computer-readable medium 400 may be accessed by a processor 402 over a computer interconnect 404. The processor 402 may be a server processor, a compute node processor, or other processor. The tangible, non-transitory, computer-readable medium 400 may include executable instructions or code to direct the processor 402 to perform the operations of the techniques described herein.

The various software components discussed herein may be stored on the tangible, non-transitory, computer-readable medium 400, as indicated in FIG. 4. For example, a debug accessor mode (DAM) enterer 406 may direct the processor 402 to detect signals on a number of pins. In an example, the pins can be CC pins such as CC1 134 and CC2 136. The DAM enterer 406 can direct the processor 402 to detect signals indicating the entrance into a debug mode. In an example each pin can carry 2.5 volts to be detected upon instructions from the DAM enterer 406 to the processor 402. In an example, the DAM enterer 406 can direct the processor 402 to detect an Rd/Rd and can enter DAM. An orientation provider 408 may direct the processor 402 to provide an orientation by directing the processor to modify the voltage on a pin. In an example, a first and a second pin can both be CC pins as indicated above. In an example, the altering of the voltage by the direction of the orientation provider 408 to the processor 402 can result in a raised or lowered voltage across one of the pins. A multiplexer (MUX) configuration (config) generator 410 may direct the processor 402 to generate a multiplexing configuration at the computer-readable medium 400 based on the orientation indication provided by the orientation provider 408. It should be understood that any number of additional software components not shown in FIG. 4 may be included within the tangible, non-transitory, computer-readable medium 400, depending on the application.

Figure 5:
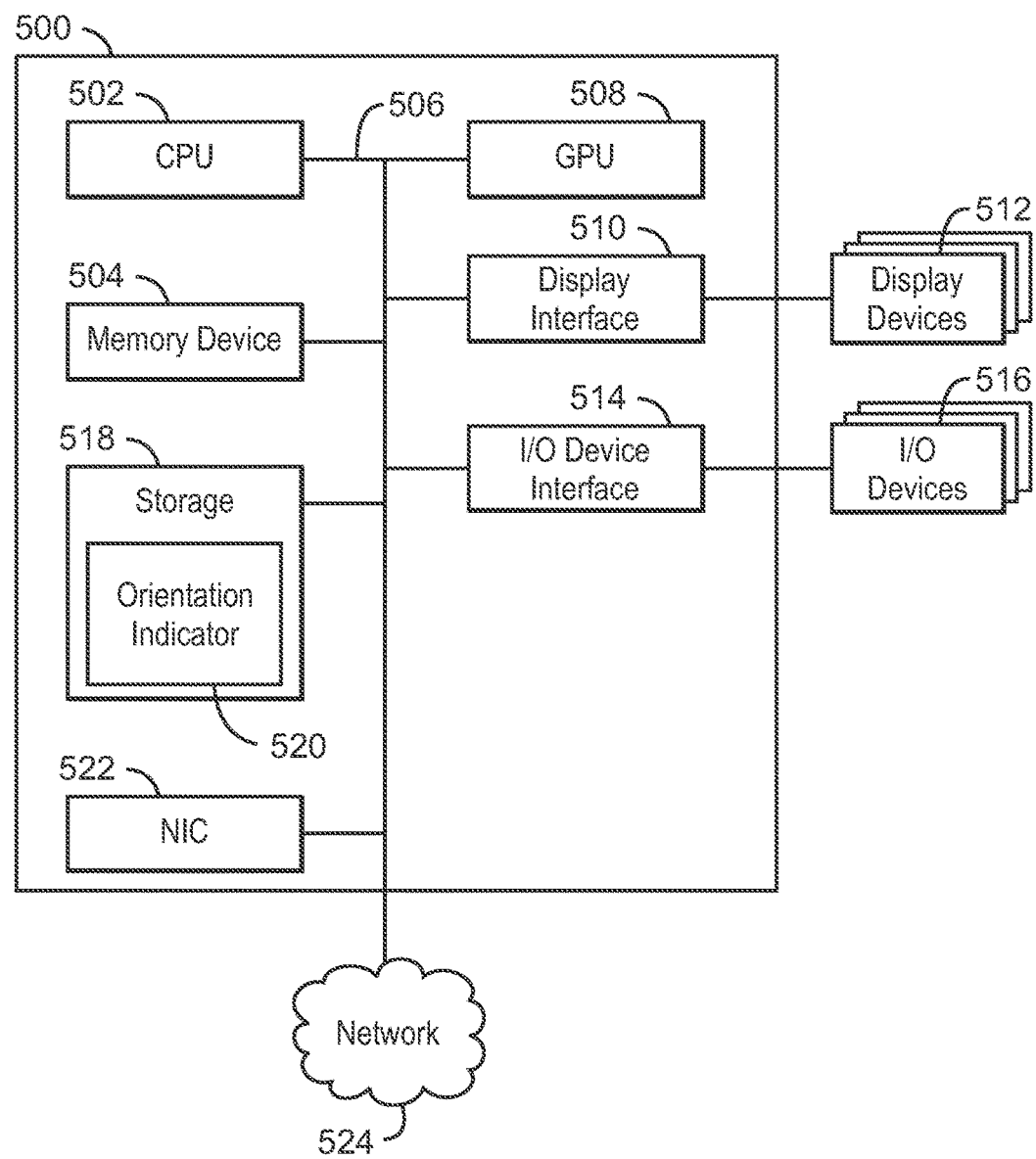
FIG. 5 is a block diagram of an example system for indicating an orientation of a connector.

FIG. 5 is a block diagram of an example system 500, such as a computing device, for indicating an orientation of a connector. The computing system 500 can be, for example, a laptop computer, desktop computer, tablet computer, mobile device, or server, among others. In particular, the computing system 500 can be a mobile device such as a cellular phone, a smartphone, a personal digital assistant (PDA), phablet, or a tablet. The computing system 500 can include a central processing unit (CPU) 502 that is configured to execute stored instructions, as well as a memory device 504 that stores instructions that are executable by the CPU 502. The CPU can be coupled to the memory device 504 by a bus 506. Additionally, the CPU 502 can be a single core processor, a multi-core processor, a computing cluster, or any number of other configurations. Furthermore, the computing system 500 can include more than one CPU 502. The memory device 504 can include random access memory (RAM), read only memory (ROM), flash memory, or any other suitable memory systems. For example, the memory device 504 can include dynamic random access memory (DRAM).

The computing system 500 can also include a graphics processing unit (GPU) 508. As shown, the CPU 502 can be coupled through the bus 506 to the GPU 508. The GPU 508 can be configured to perform any number of graphics operations within the computing system 500. For example, the GPU 508 can be configured to render or manipulate graphics images, graphics frames, videos, or the like, to be displayed to a user of the computing system 500. In embodiments, the GPU 508 includes a number of graphics engines, wherein each graphics engine is configured to perform specific graphics tasks, or to execute specific types of workloads.

The CPU 502 can be linked through the bus 506 to a display interface 510 configured to connect the computing system 500 to a display device 512. The display device 512 can include a display screen that is a built-in component of the computing system 500. The display device 512 can also include a computer monitor, television, or projector, among others, that is externally connected to the computing system 500.

The CPU 502 can also be connected through the bus 506 to an input/output (I/O) device interface 514 configured to connect the computing system 500 to one or more I/O devices 516. The I/O devices 516 can include, for example, a keyboard and a pointing device, wherein the pointing device can include a touchpad or a touchscreen, among others. The I/O devices 516 can be built-in components of the computing system 500, or can be devices that are externally connected to the computing system 500.

The computing system 500 may also include also includes a storage device 518. The storage device 518 is a physical memory such as a hard drive, a solid state drive, an optical drive, a thumbdrive, an array of drives, or any combinations thereof. The storage device 518 can also include remote storage drives such as used for cloud computing applications. The storage device 518 includes any number of applications that are configured to run on the computing system 500. The storage device 520 may include an orientation indicator 520.

The orientation indicator 520 may direct a connector to enter a debug accessory mode (DAM) based on a signal across a number of pins. The orientation indicator 520 may alter the signal on one or more of the pins while in the DAM to indicate an orientation of the connection. In an example, the altering of the signal can include a modification of the voltage provided across a pin controlled by the orientation indicator 520. The orientation indicator 520 may direct the signaling of an exit from the DAM by returning the altered signal on the at least one of the pins to an unaltered state. In another example, the orientation indicator 520 may direct the signaling of an exit from a DAM by modifying the signal the number of pins to a second altered signal. In an example where two pins are present, an exit from the accessory mode or DAM, indicated by the orientation indicator 520, can include modifying the signals on the pins to be grounded, Rp/Rp, Rd/Rd, or provided zero voltage.

The computing system 500 can also include a network interface controller (NIC) 522. The NIC 522 can be configured to connect the computing system 500 through the bus 506 to a network 524. The network 524 can be a wide area network (WAN), local area network (LAN), or the Internet, among others. In an example, the orientation indicator 520 can direct the configuration and indicating of an orientation of a connector using an all-in-one port over the network 524.

EXAMPLES

Example 1 is an apparatus having an all-in-one port, the all-in-one port. The apparatus includes a first configuration pin; a second configuration pin; logic configured to: enter into an accessory mode based on a presence of a first signal on the first configuration pin and second signal on the second configuration pin; provide an orientation indication by altering the first signal on the first configuration pin.

Example 2 includes the apparatus of example 1, including or excluding optional features. In this example, the orientation indication is provided before an operating system boots.

Example 3 includes the apparatus of any one of examples 1 to 2, including or excluding optional features. In this example, the accessory mode is a debug accessory mode. Optionally, the presence of the signal on both the first and second configuration pins is provided by a debug test system communicatively coupled to the all-in-one port. Optionally, providing the orientation indication via the logic of the apparatus generates a multiplexing configuration at the debug test system. Optionally, the debug test system provides a signal for a device under test to detect, the device under test to modify a multiplexing configuration. Optionally, the apparatus is configured as: a sink computing device during debug accessory mode; or a source device during debug accessory mode.

Example 4 includes the apparatus of any one of examples 1 to 3, including or excluding optional features. In this example, the logic is configured to alter the first signal on the first configuration pin by reducing a voltage level of the first signal on the first configuration pin. Optionally, the logic is configured to reduce the voltage level on the first signal of the first configuration pin by grounding the first signal.

Example 5 includes the apparatus of any one of examples 1 to 4, including or excluding optional features. In this example, the logic is configured to alter the first signal on the first configuration pin by increasing a voltage level of the first signal on the first configuration pin.

Example 6 is a method for orientation detection of an all-in-one port. The method includes entering into an accessory mode based on a presence of a first signal on a first configuration pin and second signal on a second configuration pin of the all-in-one port; and providing an orientation indication by altering the first signal on the first configuration pin.

Example 7 includes the method of example 6, including or excluding optional features. In this example, the orientation indication is provided without initializing an operating system software associated with the all-in-one port.

Example 8 includes the method of any one of examples 6 to 7, including or excluding optional features. In this example, the accessory mode is a debug accessory mode.

Optionally, the presence of the signal on both the first and second configuration pins is provided by a debug test system. Optionally, the method includes multiplexing at the debug test system based on the orientation indication. Optionally, the method includes configuring the all-in-one port may be configured either as a source or a sink. Optionally, the all-in-one port is configured as: a sink during debug accessory mode; or a source during debug accessory mode.

Example 9 includes the method of any one of examples 6 to 8, including or excluding optional features. In this example, altering the first signal on the first configuration pin comprises reducing a voltage level of the first signal on the first configuration pin. Optionally, reducing the voltage level on the first signal of the first configuration pin comprises grounding the first signal.

Example 10 includes the method of any one of examples 6 to 9, including or excluding optional features. In this example, altering the first signal on the first configuration pin comprises increasing a voltage level of the first signal on the first configuration pin.

Example 11 is a system for orientation detection. The system includes a target comprising: a first configuration pin; a second configuration pin; logic configured to: enter into a debug accessory mode based on a presence of a first signal on the first configuration pin and second signal on the second configuration pin; provide an orientation indication by altering the first signal on the first configuration pin; and a debug test system comprising logic configured to generate a multiplexing configuration at the debug test system based on the orientation indication.

Example 12 includes the system of example 11, including or excluding optional features. In this example, the orientation indication is provided without initializing an operating system software of the target.

Example 13 includes the system of any one of examples 11 to 12, including or excluding optional features. In this example, the target may be either configured as a source or a sink, and wherein the target is configured as a sink computing device during debug accessory mode.

Example 14 includes the system of any one of examples 11 to 13, including or excluding optional features. In this example, the target logic is configured to alter the first signal on the first configuration pin by reducing a voltage level of the first signal on the first configuration pin.

Example 15 includes the system of any one of examples 11 to 14, including or excluding optional features. In this example, the target logic is configured to alter the first signal on the first configuration pin by increasing a voltage level of the first signal on the first configuration pin.

Example 16 includes the system of any one of examples 11 to 15, including or excluding optional features. In this example, the target logic is configured to reduce the voltage level on the first signal of the first configuration pin by grounding the first signal.

Example 17 includes the system of any one of examples 11 to 16, including or excluding optional features. In this example, the target is configured as: a sink during accessory mode; or a source during accessory mode.

Example 18 includes the system of any one of examples 11 to 17, including or excluding optional features. In this example, the accessory mode is a debug accessory mode.

Example 19 includes the system of any one of examples 11 to 18, including or excluding optional features. In this example, the presence of the signal on both the first and second configuration pins is provided by a debug test system.

Example 20 includes the system of any one of examples 11 to 19, including or excluding optional features. In this example, the target signals an exit from accessory mode by returning the first signal on the first configuration pin from altered levels.

Example 21 is a tangible, non-transitory, computer-readable medium comprising instructions that, when executed by a processor, direct the processor to provide an orientation of a connector. The computer-readable medium includes instructions that direct the processor to entering into an accessory mode based on a presence of a first signal on a first configuration pin and second signal on a second configuration pin of the all-in-one port; and providing an orientation indication by altering the first signal on the first configuration pin.

Example 22 includes the computer-readable medium of example 21, including or excluding optional features. In this example, the orientation indication is provided without initializing an operating system software associated with the all-in-one port.

Example 23 includes the computer-readable medium of any one of examples 21 to 22, including or excluding optional features. In this example, the accessory mode is a debug accessory mode. Optionally, the presence of the signal on both the first and second configuration pins is provided by a debug test system. Optionally, the computer-readable medium includes multiplexing at a debug test system based on the orientation indication. Optionally, the computer-readable medium includes configuring the all-in-one port may be configured either as a source or a sink. Optionally, the all-in-one port is configured as: a sink during debug accessory mode; or a source during debug accessory mode.

Example 24 includes the computer-readable medium of any one of examples 21 to 23, including or excluding optional features. In this example, altering the first signal on the first configuration pin comprises reducing a voltage level of the first signal on the first configuration pin. Optionally, reducing the voltage level on the first signal of the first configuration pin comprises grounding the first signal.

Example 25 includes the computer-readable medium of any one of examples 21 to 24, including or excluding optional features. In this example, altering the first signal on the first configuration pin comprises increasing a voltage level of the first signal on the first configuration pin.

Example 26 is an apparatus having an all-in-one port, the all-in-one port. The apparatus includes instructions that direct the processor to a first configuration pin; a second configuration pin; means to enter into an accessory mode based on a presence of a first signal on the first configuration pin and second signal on the second configuration pin; and means to provide an orientation indication by altering the first signal on the first configuration pin.

Example 27 includes the apparatus of example 26, including or excluding optional features. In this example, the orientation indication is provided without initializing an operating system software of the apparatus.

Example 28 includes the apparatus of any one of examples 26 to 27, including or excluding optional features. In this example, the accessory mode is a debug accessory mode. Optionally, the presence of the signal on both the first and second configuration pins is provided by a debug test system communicatively coupled to the all-in-one port. Optionally, providing the orientation indication via a means of the apparatus to generate a multiplexing configuration at a debug test system. Optionally, the apparatus is a computing device that may be either configured as a source computing device or a sink computing device. Optionally, the apparatus is configured as: a sink computing device during debug accessory mode; or a source device during debug accessory mode.

Example 29 includes the apparatus of any one of examples 26 to 28, including or excluding optional features. In this example, means of the apparatus alter the first signal on the first configuration pin by reducing a voltage level of the first signal on the first configuration pin.

Example 30 includes the apparatus of any one of examples 26 to 29, including or excluding optional features. In this example, means of the apparatus reduce the voltage level on the first signal of the first configuration pin by grounding the first signal.

Example 31 includes the apparatus of any one of examples 26 to 30, including or excluding optional features. In this example, means of the apparatus alter the first signal on the first configuration pin by increasing a voltage level of the first signal on the first configuration pin.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus having an all-in-one port, the all-in-one port, comprising:
    a first configuration pin;
    a second configuration pin;
    logic configured to:
        enter into a debug accessory mode based on a presence of a first signal on the first configuration pin and second signal on the second configuration pin;
        provide an orientation indication by altering the first signal on the first configuration pin
        generate a multiplexing configuration at a debug test system in response to the provided orientation indication.

2. The apparatus of claim 1, wherein the orientation indication is provided before an operating system boots.

3. The apparatus of claim 1, wherein the presence of the signal on both the first and second configuration pins is provided by the debug test system which is communicatively coupled to the all-in-one port.

4. The apparatus of claim 1, wherein the debug test system provides a signal for a device under test to detect, the device under test to modify a multiplexing configuration.

5. The apparatus of claim 1, wherein the logic is configured to alter the first signal on the first configuration pin by reducing a voltage level of the first signal on the first configuration pin.

6. The apparatus of claim 1, wherein the logic is configured to alter the first signal on the first configuration pin by increasing a voltage level of the first signal on the first configuration pin.

7. The apparatus of claim 4, wherein the apparatus is configured as:
    a sink computing device during debug accessory mode; or
    a source device during debug accessory mode.

8. The apparatus of claim 5, wherein the logic is configured to reduce the voltage level on the first signal of the first configuration pin by grounding the first signal.

9. A method for orientation detection of an all-in-one port, comprising;
    entering into a debug accessory mode based on a presence of a first signal on a first configuration pin and second signal on a second configuration pin of the all-in-one port;
    providing an orientation indication by altering the first signal on the first configuration pin; and
    generating a multiplexing configuration at a debug test system based on the provided orientation indication.

10. The method of claim 9, wherein the orientation indication is provided without initializing an operating system software associated with the all-in-one port.

11. The method of claim 9, wherein the presence of the signal on both the first and second configuration pins is provided by the debug test system.

12. The method of claim 9, wherein altering the first signal on the first configuration pin comprises reducing a voltage level of the first signal on the first configuration pin.

13. The method of claim 9, wherein altering the first signal on the first configuration pin comprises increasing a voltage level of the first signal on the first configuration pin.

14. The method of claim 9, further comprising configuring the all-in-one port may be configured either as a source or a sink.

15. The method of claim 14, wherein the all-in-one port is configured as:
a sink during debug accessory mode; or
a source during debug accessory mode.

16. The method of claim 12, wherein reducing the voltage level on the first signal of the first configuration pin comprises grounding the first signal.

17. A system for orientation detection, comprising
a target comprising:
a first configuration pin;
a second configuration pin;
logic configured to:
enter into a debug accessory mode based on a presence of a first signal on the first configuration pin and second signal on the second configuration pin; and
provide an orientation indication by altering the first signal on the first configuration pin
generate a multiplexing configuration at a debug test system.

18. The system of claim 17, wherein the orientation indication is provided without initializing an operating system software of the target.

19. The system of claim 17, wherein the target may be either configured as a source or a sink, and wherein the target is configured as a sink computing device during debug accessory mode.

20. The system of claim 17, wherein the target logic is configured to alter the first signal on the first configuration pin by reducing a voltage level of the first signal on the first configuration pin.

21. The system of claim 17, wherein the target logic is configured to alter the first signal on the first configuration pin by increasing a voltage level of the first signal on the first configuration pin.

* * * * *